(12) United States Patent
Lee et al.

(10) Patent No.: US 7,452,815 B2
(45) Date of Patent: Nov. 18, 2008

(54) METHODS OF FORMING INTEGRATED CIRCUIT DEVICES HAVING POLISHED TUNGSTEN METAL LAYERS THEREIN

(75) Inventors: Jae Seok Lee, Uiwang-Shi (KR); Kil Sung Lee, Kwachon-Shi (KR)

(73) Assignee: Cheil Industries, Inc. (KR)

( * ) Notice: Subject to any disclaimer, the term of this patent is extended or adjusted under 35 U.S.C. 154(b) by 0 days.

(21) Appl. No.: 11/148,670

(22) Filed: Jun. 9, 2005

(65) Prior Publication Data

US 2005/0227491 A1     Oct. 13, 2005

Related U.S. Application Data

(60) Division of application No. 10/959,228, filed on Oct. 6, 2004, now Pat. No. 6,953,389, which is a continuation-in-part of application No. 10/485,500, filed as application No. PCT/KR02/01492 on Aug. 6, 2002, now Pat. No. 6,930,054.

(30) Foreign Application Priority Data

Aug. 9, 2001   (KR)  ............................... 2001-47895
May 21, 2002   (KR)  ............................... 2002-28052

(51) Int. Cl.
    *H01L 21/302*     (2006.01)
    *H01L 21/461*     (2006.01)
(52) U.S. Cl. .................. 438/692; 438/693; 438/745
(58) Field of Classification Search .................. 438/692, 438/693, 745
See application file for complete search history.

(56) References Cited

U.S. PATENT DOCUMENTS 3,438,811 A     4/1969     Harriman et al.

(Continued)

FOREIGN PATENT DOCUMENTS

EP     0 708 160 B1     4/1996

(Continued)

OTHER PUBLICATIONS

Basak et al., "Electrochemical Aspects of the Chemical Mechanical Planarization of Tungsten," Electrochemical Society Proceedings, Pennington, NJ, 1997, vol. 96-22, pp. 137-148.

(Continued)

*Primary Examiner*—Nadine Norton
*Assistant Examiner*—Mahmoud Dahimene
(74) *Attorney, Agent, or Firm*—Myers Bigel Sibley & Sajovec

(57) ABSTRACT

Methods of forming integrated circuit devices use metal CMP slurry compositions having relatively low chemical etch rate and relatively high mechanical polishing rate characteristics. The relatively high mechanical polishing rate characteristics are achieved using relatively high concentrations of mechanical abrasive (e.g., $\geq 8$ wt %) in combination with sufficient quantities of a wetting agent to inhibit micro-scratching of underlying surfaces (e.g., insulating layers, conductive vias, . . . ) being polished. The slurry compositions also include a highly stable metal-propylenediaminetetraacetate (M-PDTA) complex, which may operate to inhibit metal-oxide re-adhesion on the metal surface being polished and/or inhibit oxidation of the metal surface by chelating with the surface.

12 Claims, 2 Drawing Sheets

U.S. PATENT DOCUMENTS

| | | |
|---|---|---|
| 3,597,290 A | 8/1971 | Naito et al. |
| 3,681,022 A | 8/1972 | Kibbel, Jr. et al. |
| 3,877,938 A | 4/1975 | Shinozaki et al. |
| 3,962,005 A | 6/1976 | Lerner |
| 4,086,176 A | 4/1978 | Ericson et al. |
| 4,130,454 A | 12/1978 | Dutkewych et al. |
| 4,140,646 A | 2/1979 | Kent et al. |
| 4,144,119 A | 3/1979 | Dutkewych et al. |
| 4,297,436 A | 10/1981 | Kubotera et al. |
| 4,305,779 A | 12/1981 | Steeves et al. |
| 4,405,571 A | 9/1983 | Vadasdi et al. |
| 4,444,601 A | 4/1984 | Greene |
| 4,448,634 A | 5/1984 | Lampert |
| 4,885,106 A | 12/1989 | Lapham et al. |
| 4,954,142 A | 9/1990 | Carr et al. |
| 4,956,015 A | 9/1990 | Okajima et al. |
| 4,956,313 A | 9/1990 | Cote et al. |
| 4,959,113 A | 9/1990 | Roberts |
| 5,084,071 A | 1/1992 | Nenadic et al. |
| 5,102,499 A | 4/1992 | Jodgens et al. |
| 5,200,166 A | 4/1993 | Shiga et al. |
| 5,209,816 A | 5/1993 | Yu et al. |
| 5,225,034 A | 7/1993 | Yu et al. |
| 5,244,534 A | 9/1993 | Yu et al. |
| 5,256,402 A | 10/1993 | Prencipe et al. |
| 5,340,370 A | 8/1994 | Cadien et al. |
| 5,354,490 A | 10/1994 | Yu et al. |
| 5,391,258 A | 2/1995 | Brancaleoni et al. |
| 5,403,779 A | 4/1995 | Joshi et al. |
| 5,407,526 A | 4/1995 | Danielson et al. |
| 5,418,115 A | 5/1995 | Tsubai et al. |
| 5,516,346 A | 5/1996 | Cadien et al. |
| 5,527,423 A | 6/1996 | Neville et al. |
| 5,534,462 A | 7/1996 | Fiordalice et al. |
| 5,538,152 A | 7/1996 | Fontana |
| 5,575,837 A | 11/1996 | Kodama et al. |
| 5,575,885 A | 11/1996 | Hirabayashi et al. |
| 5,612,250 A | 3/1997 | Ohtani et al. |
| 5,662,769 A | 9/1997 | Schonauer et al. |
| 5,674,787 A * | 10/1997 | Zhao et al. ............... 438/627 |
| 5,709,593 A | 1/1998 | Guthrie et al. |
| 5,746,606 A | 5/1998 | Sobhani |
| 5,770,095 A | 6/1998 | Sasaki et al. |
| 5,783,489 A | 7/1998 | Kaufman et al. |
| 5,800,577 A | 9/1998 | Kido |
| 5,804,513 A | 9/1998 | Sakatani et al. |
| 5,846,398 A | 12/1998 | Carpio |
| 5,854,096 A | 12/1998 | Ohtani et al. |
| 5,858,813 A | 1/1999 | Scherber et al. |
| 5,863,838 A | 1/1999 | Farkas et al. |
| 5,916,011 A | 6/1999 | Kim et al. |
| 5,916,855 A | 6/1999 | Avanzino et al. |
| 5,922,091 A | 7/1999 | Tsai et al. |
| 5,948,697 A | 9/1999 | Hata |
| 5,958,288 A | 9/1999 | Mueller et al. |
| 5,980,775 A | 11/1999 | Grumbine et al. |
| 5,993,686 A | 11/1999 | Streinz et al. |
| 6,015,506 A | 1/2000 | Streinz et al. |
| 6,030,425 A | 2/2000 | Hata |
| 6,068,787 A | 5/2000 | Grumbine et al. |
| 6,190,443 B1 * | 2/2001 | Ohashi et al. ............... 106/3 |
| 6,258,140 B1 | 7/2001 | Shemo et al. |
| 6,342,166 B1 * | 1/2002 | Ide et al. ............... 216/84 |
| 6,364,919 B1 | 4/2002 | Lee et al. |
| 6,447,694 B1 | 9/2002 | Lee et al. |
| 6,488,730 B2 | 12/2002 | Lee et al. |
| 6,514,352 B2 | 2/2003 | Gotoh et al. |
| 6,527,622 B1 | 3/2003 | Brusic et al. |
| 6,551,367 B2 | 4/2003 | Lee et al. |
| 6,551,935 B1 | 4/2003 | Sinha et al. |
| 6,604,987 B1 | 8/2003 | Sun |
| 6,632,377 B1 | 10/2003 | Brusic et al. |
| 6,653,242 B1 | 11/2003 | Sun et al. |
| 6,686,322 B1 | 2/2004 | Nohara et al. |
| 6,689,258 B1 | 2/2004 | Lansford et al. |
| 6,716,755 B2 | 4/2004 | Lai et al. |
| 6,721,628 B1 | 4/2004 | Lai et al. |
| 6,722,950 B1 | 4/2004 | Dabral et al. |
| 6,733,553 B2 | 5/2004 | Kido et al. |
| 6,739,951 B2 | 5/2004 | Sun et al. |
| 6,852,009 B2 | 2/2005 | Kawase et al. |
| 6,869,336 B1 | 3/2005 | Hardikar |
| 2002/0061635 A1 | 5/2002 | Lee et al. |
| 2002/0066465 A1 | 6/2002 | Gotoh et al. |
| 2002/0077035 A1 * | 6/2002 | Wang et al. ............... 451/41 |
| 2002/0145127 A1 | 10/2002 | Kaufman et al. |
| 2003/0027499 A1 | 2/2003 | Fang et al. |
| 2003/0060135 A1 | 3/2003 | Moeggenborg et al. |
| 2003/0077985 A1 | 4/2003 | Zhou et al. |
| 2003/0082998 A1 | 5/2003 | Carter et al. |
| 2003/0124959 A1 | 7/2003 | Schroeder et al. |
| 2003/0134575 A1 | 7/2003 | Fang |
| 2003/0143848 A1 | 7/2003 | Steckenrider et al. |
| 2003/0166337 A1 | 9/2003 | Wang et al. |
| 2003/0168628 A1 | 9/2003 | Vacassy |
| 2003/0181142 A1 | 9/2003 | De Rege Thesauro et al. |
| 2003/0203635 A1 | 10/2003 | Wang et al. |
| 2003/0209522 A1 | 11/2003 | Grumbine et al. |
| 2003/0211815 A1 | 11/2003 | Carter et al. |
| 2003/0226998 A1 | 12/2003 | Grumbine |
| 2003/0228763 A1 | 12/2003 | Schroeder et al. |
| 2004/0009671 A1 | 1/2004 | Kaufman et al. |
| 2004/0082276 A1 | 4/2004 | Prasad |

FOREIGN PATENT DOCUMENTS

| | | |
|---|---|---|
| EP | 0 826 756 A2 | 3/1998 |
| EP | 0 846 742 A2 | 6/1998 |
| EP | 0 844 290 B1 | 3/2002 |
| JP | 04-275387 | 9/1992 |
| JP | 10-44047 A | 2/1998 |
| KR | 2001/109960 A | 12/2001 |
| WO | WO 97/43087 A1 | 11/1997 |
| WO | WO98/23408 A1 | 6/1998 |
| WO | WO98/23697 A1 | 6/1998 |
| WO | WO99/53532 | 10/1999 |
| WO | WO03/15148 A1 | 2/2003 |

OTHER PUBLICATIONS

Farkas et al, "Oxidation and Etching of Tungsten in CMP Slurries," Conference Proceedings USLI-X, 1995 Materials Research Society, pp. 25-32.

Kaufman et al., "Chemical-Mechanical Polishing for Fabricating Patterned W Metal Features as Chip Interconnects," J. Electrochem. Soc., vol. 138, No. 11, Nov. 1991, pp. 3460-3464.

M.R. Oliver, "Chemical-Mechanical Planarization of Semiconductor Materials," Oct. 2003, Chapter 2, pp. 7-40.

M.R. Oliver, "Chemical-Mechanical Planarization of Semiconductor Materials," Oct. 2003, Chapter 3, pp. 41-83.

M.R. Oliver, "Chemical-Mechanical Planarization of Semiconductor Materials," Oct. 2003, Chapter 4, pp. 85-132.

M.R. Oliver, "Chemical-Mechanical Planarization of Semiconductor Materials," Oct. 2003, Chapter 7, pp. 215-249.

Raghunath et al., "Mechanistic Aspects of Chemical Mechanical Polishing of Tungsten Using Ferric Ion Based Alumina Slurries," Electrochemical Society Proceedings, Pennington, NJ, 1997, vol. 96-22, pp. 1-15.

Steigerwald et al. "Chemical Mechanical Planarization of Microelectronic Materials," 1997, Chapter 4, pp. 48-128.

Steigerwald et al. "Chemical Mechanical Planarization of Microelectronic Materials," 1997, Chapter 6, pp. 181-208.

Stein et al., "In Situ Electrochemical Investigation of Tungsten Electrochemical Behavior during Chemical Mechanical Polishing," J. Electrochem. Soc., vol. 145, No. 9, Sep. 1998, pp. 3190-3196.

Streinz et al., "An Electrochemical Approch to Slurry Characterization and Development for W CMP," Electrochemical Society Proceedings, Pennington, NJ, 1997, vol. 96-22, pp. 159-175.

* cited by examiner

US 7,452,815 B2

METHODS OF FORMING INTEGRATED CIRCUIT DEVICES HAVING POLISHED TUNGSTEN METAL LAYERS THEREIN

REFERENCE TO PRIORITY APPLICATION

This application is a divisional of U.S. application Ser. No. 10/959,228, filed Oct. 6, 2004 now U.S. Pat. No. 6,953,389, which is a continuation-in-part (CIP) of U.S. application Ser. No. 10/485,500, filed Jul. 1, 2004, now U.S. Pat. No. 6,930,054 which is a 371 of PCT/KR02/01492, filed Aug. 6, 2002, which derives priority from Korean Application Nos. 2001-47895, filed Aug. 9, 2001, and 2002-28052, filed May 21, 2002, the disclosures of which are hereby incorporated herein by reference.

FIELD OF THE INVENTION

The present invention relates to methods of forming integrated circuit devices and, more particularly, to methods of planarizing metal layers on integrated circuit substrates using chemical-mechanical polishing techniques.

BACKGROUND OF THE INVENTION

Integrated circuit chips frequently utilize multiple levels of patterned metallization and large numbers of electrically conductive vias to provide wiring interconnects between electronic devices embedded within an integrated circuit substrate (e.g., semiconductor substrate). In a typical case, an electrically conductive via may extend vertically through one or more electrically insulating layers to thereby provide an electrical "short" between lower and upper levels of metallization. As illustrated by FIGS. 1A-1C, one conventional technique for forming electrically conductive vias includes forming an electrically insulating layer 12 (e.g., $SiO_2$) on a surface of a semiconductor substrate 10 having a plurality of active regions (not shown) therein that extend adjacent the surface. Conventional techniques may then be used to define a plurality of contact holes 16 that extend through the electrically insulating layer 12 and expose respective ones of the active regions (e.g., N or P-type diffusion regions). A metal layer 14 (e.g., a tungsten (W) layer) may then be conformally deposited on an upper surface of the electrically insulating layer 12 and into the contact holes 16. As illustrated, this metal layer 14, which may be of sufficient thickness to completely fill the contact holes 16, may nonetheless include a plurality of metallurgical seams 18 that identify where two facing surfaces of the metal layer 14 contact each other within the contact holes 16. These seams 18 may be present even in the absence of metal voids within the contact holes 18.

As illustrated by FIG. 1B, a portion of the metal layer 14 residing on the upper surface of the electrically insulating layer 12 may be removed to thereby define a plurality of conductive vias 20. This removal step may include chemically-mechanically polishing the metal layer 14 with a polishing slurry. The polishing step may be performed for a sufficient duration to expose the upper surface of the electrically insulating layer 12. In some instances, the polishing step may result in the formation of open seams 18' that constitute parasitic voids within the conductive vias 20. The formation of the open seams 18' can be an adverse consequence of using a polishing slurry containing chemical etchants that aggressively etch the metal layer 14 during the polishing step. The use of aggressive chemical etchants within the polishing slurry may also result in an excessive etch-back (i.e., recession) of the upper surfaces of the conductive vias 20, as illustrated by FIG. 1C. This excessive etch-back may occur even when the polishing step is followed immediately with a thorough cleaning step upon detecting exposure of the upper surface of the electrically insulating layer 12 during polishing. The occurrence of excessive etch-back of the conductive vias 20 may result in a lack of planarization between the upper surface of the electrically insulating layer 12 and the upper surfaces of the conductive vias 20 and thereby complicate further back-end processing steps.

One technique for chemically-mechanically polishing metal layers at purportedly high chemical etch rates is disclosed in U.S. Pat. No. 6,068,787 to Grumbine et al. The '787 patent alleges that a catalytic amount of ferric nitrate, a known oxidant, can be added to another known oxidant (e.g., hydrogen peroxide) to achieve a synergistic effect within a CMP slurry, which results in a high chemical etch rate and a high overall polishing rate for tungsten metal layers. The use of iron as a catalyst to accelerate CMP polishing is also disclosed in U.S. Pat. No. 5,948,697 to Hata. U.S. Pat. No. 5,709,593 to Guthrie et al. also discloses polishing of metallic, semiconductor and insulating layers using slurries containing reactive agents, abrasives and catalysts. Unfortunately, CMP slurries that cause high chemical etch rates may be susceptible to the excessive etch-back characteristics described above with respect to FIGS. 1A-1C.

An article by S. Basak et al., entitled "Electrochemical Aspects of the Chemical Mechanical Planarization of Tungsten," Proceedings of the First International Symposium on Chemical Mechanical Planarization, Electrochemical Society, Vol. 96-22, pp. 137-148, also discloses using ferric nitrate in combination with hydrogen peroxide in CMP slurries. The use of ferric nitrate and other additives (e.g., complexing agents) in CMP slurries is also disclosed at section 7.3.3 and Table 7.1 of a textbook by M. R. Oliver (Ed.), entitled "Chemical-Mechanical Planarization of Semiconductor Materials," ISBN 3-540-43181-0, Springer-Verlag (2004). One drawback to the use of ferric nitrate in CMP slurries is the generation of free Fe-ions during oxidation, which may remain as contaminants on a planarized surface after polishing and normal cleaning. As described in U.S. Pat. No. 5,662,769 to Schonauer et al., these free metal ions may be removed from a semiconductor surface using a ligand such as EDTA, which forms a highly stable complex with metal ions and thereby inhibits deposition of such free metal ions on a planarized surface.

Slurries having relatively high concentrations of abrasives may also be used to increase an overall CMP polishing rate. However, such high concentrations of abrasives may lead to high levels of micro-scratches and other defects on a planarized surface. To address this problem, additional CMP techniques, such as those disclosed in U.S. patent Publication No. 2002/0061635 to Lee et al., have been developed that eliminate the need for abrasives altogether.

SUMMARY OF THE INVENTION

Embodiments of the present invention include metal CMP slurry precursor compositions for semiconductor wafer processing. These slurry precursor compositions may be mixed with appropriate oxidizing agents (e.g., hydrogen peroxide) to achieve metal CMP slurry compositions having relatively low chemical etch rate and relatively high mechanical polishing rate characteristics. The relatively high mechanical polishing rate characteristics are achieved using relatively high concentrations of mechanical abrasive (e.g., $\geq 8$ wt %) in combination with sufficient quantities of a wetting agent to inhibit micro-scratching of underlying surfaces (e.g., insulating layers, conductive vias, . . . ) being polished. The slurry precursor compositions also include a highly stable metal-propylenediaminetetraacetate (M-PDTA) complex, which may operate to inhibit metal-oxide re-adhesion on the metal surface being polished and/or limit the maximum rate of oxidation of the metal surface by chelating with the metal surface.

In particular, some embodiments of the present invention include a slurry precursor composition for chemical-mechanical polishing of metal layers on semiconductor substrates. This slurry precursor composition includes an aqueous admixture of at least one pH controlling agent, a carboxylic acid, an abrasive, a metal-propylenediaminetetraacetate (M-PDTA) complex, a wetting agent and deionized water. The pH controlling agent may include at least one of an inorganic acid and a hydroxide and the wetting agent may be diethylene glycol. The quantity of the wetting agent in the aqueous admixture is typically in a range from about 0.4 wt % to about 1.2 wt %. To achieve a relatively high mechanical polishing rate, the quantity of the abrasive in the aqueous admixture preferably exceeds about 8 wt % and, more preferably, is in a range from about 10 w % to about 12 wt %. The M-PDTA complex may be a Fe-PDTA complex and the quantity of the Fe-PDTA complex in the aqueous admixture may be in a range from about 0.1 wt % to about 0.8 wt %.

Other embodiments of the present invention include slurry compositions for chemical-mechanical polishing of tungsten (W) metal layers on semiconductor substrates. These slurry compositions include an aqueous admixture containing hydrogen peroxide, potassium hydroxide, nitric acid and malic acid. The malic acid is provided in an amount ranging from about 0.4 wt % to about 0.8 wt %. The admixture also contains a silica abrasive in an amount exceeding 8 wt %, an Fe-PDTA complex in an amount ranging from about 0.1 wt % to about 0.8 wt %, diethylene glycol in an amount ranging from about 0.4 wt % to about 1.2 wt % and deionized water.

Still further embodiments of the present invention include methods of forming integrated circuit devices by forming an electrically insulating layer on a surface of a semiconductor wafer and forming a plurality of contact holes in the electrically insulating layer. A layer of tungsten metal is conformally deposited on the electrically insulating layer and into the plurality of contact holes. A chemical-mechanical polishing step is then performed. This polishing step includes polishing the tungsten metal layer using a slurry composition comprising hydrogen peroxide, an abrasive in an amount exceeding 8 wt %, an Fe-PDTA complex in an amount ranging from about 0.1 wt % to about 0.8 wt %, a wetting agent in an amount ranging from about 0.4 wt % to about 1.2 wt % and deionized water. The polishing step is followed by the steps of exposing the electrically insulating layer to a cleaning solution and performing additional back-end processing steps to complete the semiconductor wafer. The semiconductor wafer is then diced into a plurality of semiconductor chips, which may be individually packaged.

DETAILED DESCRIPTION OF PREFERRED EMBODIMENTS

Figure 1A:
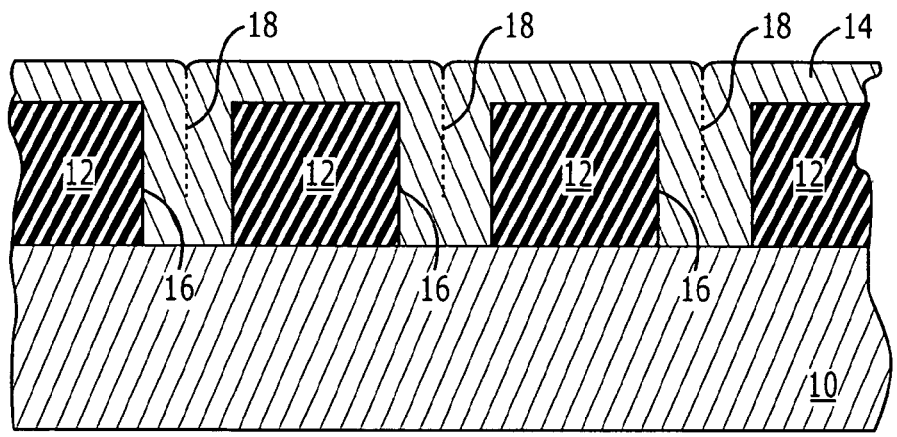
FIGS. 1A-1C are cross-sectional views of intermediate structures that illustrate conventional methods of forming conductive vias on semiconductor substrates using chemical-mechanical polishing techniques.
Figure 1B:
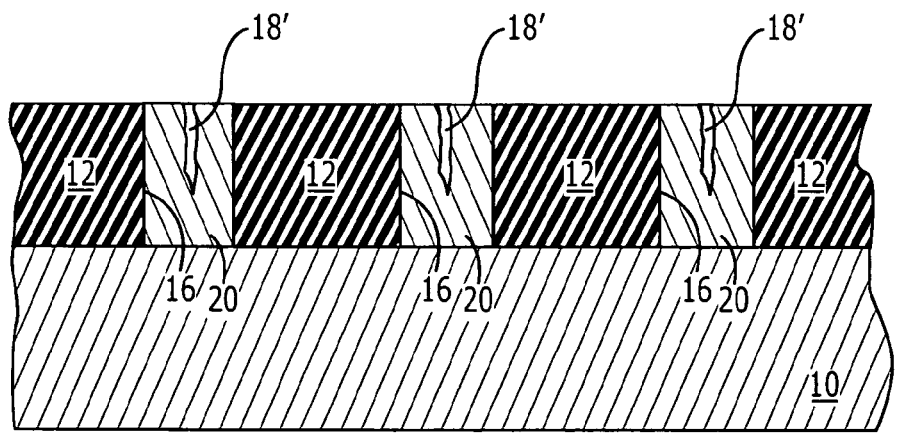
Figure 1C:
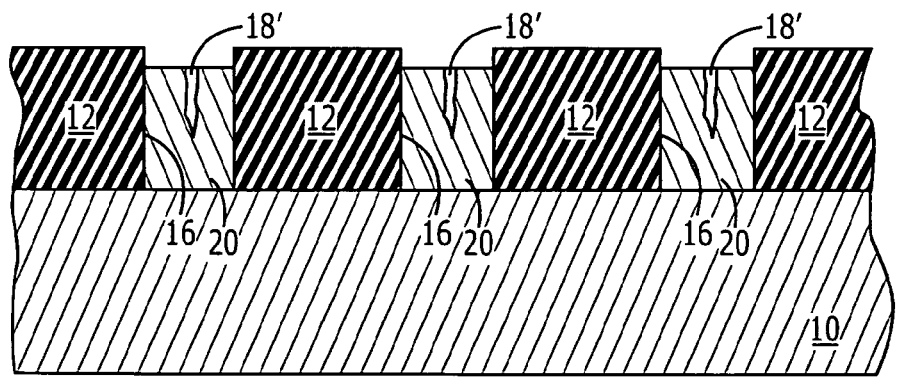

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

Figure 2:
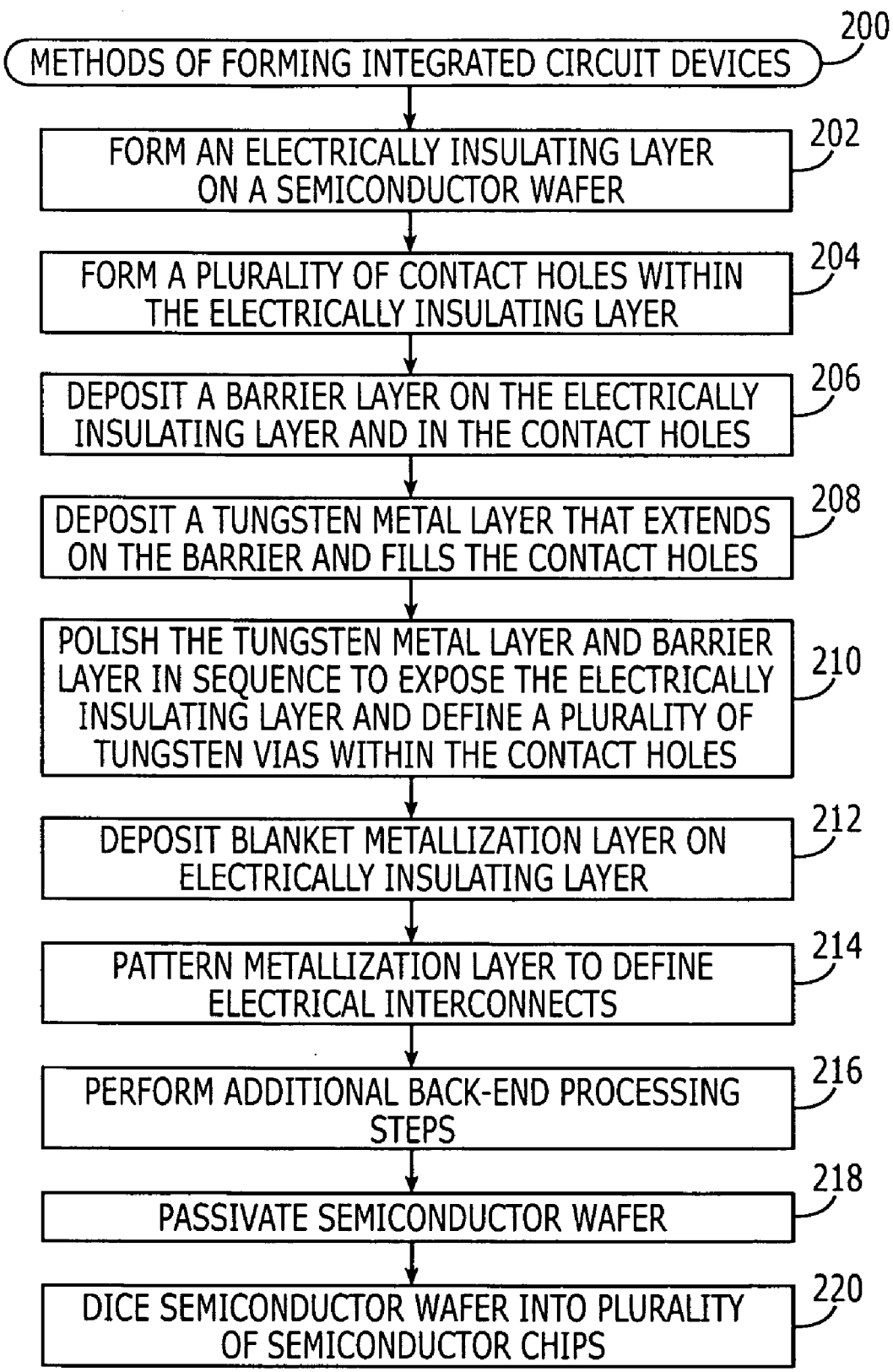
FIG. 2 is a flow diagram that illustrates methods of forming integrated circuit devices according to embodiments of the present invention.

Embodiments of the present invention include metal CMP slurry precursor compositions for semiconductor wafer processing. As illustrated by FIG. 2, methods 200 of forming integrated circuit devices may include at least one chemical-mechanical polishing step 210 that is performed during the course of semiconductor wafer processing. The preferred slurry precursor compositions may be mixed with appropriate oxidizing agents (e.g., hydrogen peroxide) at the time of polishing to achieve metal CMP slurry compositions having relatively low chemical etch rate and relatively high mechanical polishing rate characteristics. The relatively high mechanical polishing rate characteristics are achieved using relatively high concentrations of mechanical abrasive (e.g., $\geq 8$ wt % silica) in combination with sufficient quantities of a wetting agent (e.g., diethylene glycol) to inhibit microscratching of underlying surfaces (e.g., insulating layers, conductive vias, . . . ) being polished. The slurry precursor compositions also include a highly stable metal-propylenediaminetetraacetate (M-PDTA) complex, which may operate to inhibit metal-oxide re-adhesion on the metal surface being polished and/or limit the maximum rate of oxidation of the metal surface by chelating with the metal surface. A preferred M-PDTA complex is Fe-PDTA. This M-PDTA may also operate to inhibit coagulation of the high concentration of abrasive.

In particular, the methods 200 of FIG. 2 include the step of forming an electrically insulating layer on a semiconductor wafer, Block 202. This electrically insulating layer may be formed directly on a surface of the semiconductor wafer or may be formed as an interlayer dielectric layer on one or more underlying layers that are disposed between the interlayer dielectric layer and the surface of the semiconductor wafer. A plurality of contact holes may be formed in the electrically insulating layer, Block 204. These contact holes may be formed using conventional photolithographically defined patterning and etching steps. An optional barrier layer (e.g., Ti/TiN) may then be conformally deposited on an upper surface of the electrically insulating layer and along sidewalls (and bottoms) of the contact holes, Block 206. Thereafter, a metal layer, such as a tungsten (W) metal layer, is deposited on the electrically insulating layer, Block 208. The thickness of this metal layer is sufficient to fill the contact holes.

As illustrated by Block 210, a chemical-mechanical polishing (CMP) step is then performed on the metal layer and barrier layer using the slurry composition described herein. The duration of this step is sufficient to expose an upper surface the electrically insulating layer and define a plurality of tungsten-based conductive vias within the contact holes. The upper surfaces of these conductive vias is coplanar with the exposed upper surface of the electrically insulating layer. To inhibit recession of the conductive vias within the contact holes, the detection of an end-point of the polishing step is followed immediately with a wafer cleaning step to remove the slurry composition and contaminants from the planarized surface of the wafer. Conventional steps may then be performed to deposit and pattern a blanket layer of metallization into a plurality of electrical interconnects that extend on the planarized upper surface of the electrically insulating layer, Block 212-214. The formation of the electrical interconnects may be followed by additional processing steps, including additional insulator deposition and CMP polishing steps. Additional back-end wafer processing and passivation steps may also be performed, Blocks 216-218. Thereafter, the semiconductor wafer may be diced into a plurality of semiconductor chips, which may be separately packaged as respective integrated circuit devices, Block 220.

The CMP polishing step, Block 210, includes mixing a slurry precursor composition with at least one oxidizing agent. A preferred oxidizing agent is hydrogen peroxide ($H_2O_2$). As explained in commonly assigned U.S. application Ser. No. 10/485,500, which is hereby incorporated herein by reference, oxidizing agents other than hydrogen peroxide may also be used in alternative slurry compositions. The slurry precursor composition includes an aqueous admixture of at least one pH controlling agent, a carboxylic acid (e.g, malic acid), an abrasive (e.g., silica), a metal-propylenediaminetetraacetate (M-PDTA) complex, a wetting agent, which inhibits micro-scratching even in the presence of a high quantity of the abrasive, and deionized water. The pH controlling agent may include at least one of an inorganic acid (e.g., nitric acid) and a hydroxide (potassium hydroxide) and the wetting agent may be diethylene glycol (DEG). Sufficient quantities of the pH controlling agent may be used to achieve a pH for the slurry composition in a range from about 2.4 to about 2.7 at a temperature of 25° C.

The quantity of the wetting agent in the aqueous admixture is typically in a range from about 0.4 wt % to about 1.2 wt % and, more preferably, about 0.8 wt %. To achieve a relatively high mechanical polishing rate, the quantity of the abrasive in the aqueous admixture preferably exceeds about 8 wt % and, more preferably, is in a range from about 10 w % to about 12 wt % (and possibly even higher). The abrasive may be silica having a mean size in a range from about 140 nm to about 180 nm. The M-PDTA complex may be a Fe-PDTA complex and the quantity of the Fe-PDTA complex in the aqueous admixture may be in a range from about 0.1 wt % to about 0.8 wt % and, more preferably about 0.4 wt %. The addition of hydrogen peroxide at a concentration of about 2 wt % at the time of polishing can be used to achieve a relatively high overall polishing rate of about 2400-2600 Å/min, with a relatively low static chemical etch rate of only about 12 Å/min (in the absence of mechanical polishing). This relatively low static chemical etch rate advantageously limits recession of the tungsten vias within the contact holes upon completion of the polishing step. In some embodiments, concentrations of the constituents of the slurry composition can be selected to limit the static chemical etch rate to a range from about 5 Å/min to about 15 Å/min. As illustrated by Table 2 of the aforementioned '500 application, this range of static chemical etch rates, which is also referred to as a corrosion rate, is considerably lower than those for conventional slurry compositions including those containing ferric nitrate as an oxidant.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming integrated circuit devices, comprising the steps of:
    forming an electrically insulating layer on a surface of a semiconductor wafer;
    forming a plurality of contact holes in the electrically insulating layer;
    depositing a tungsten metal layer that extends on the electrically insulating layer and into the plurality of contact holes; and
    polishing the tungsten metal layer using a slurry composition comprising hydrogen peroxide, an abrasive in an amount exceeding 8 wt %, an Fe-PDTA complex in an amount ranging from about 0.1 wt % to about 0.8 wt %, a wetting agent in an amount ranging from about 0.4 wt % to about 1.2 wt % and water.

2. The method of claim 1, wherein said polishing step is followed by the steps of:
    exposing the electrically insulating layer to a cleaning solution; and
    dicing the semiconductor wafer into a plurality of semiconductor chips.

3. The method of claim 2, further comprising the step of packaging the plurality of semiconductor chips into a plurality of packaged integrated circuit devices.

4. The method of claim 1, wherein the slurry composition further comprises carboxylic acid.

5. The method of claim 4, wherein the wetting agent is diethylene glycol.

6. The method of claim 1, wherein the wetting agent is diethylene glycol.

7. The method of claim 1, wherein the abrasive is silica.

8. The method of claim 4, wherein the slurry composition further comprises a pH controlling agent selected from a group consisting of inorganic acids and hydroxides.

9. The method of claim 1, wherein the slurry composition further comprises a pH controlling agent selected from a group consisting of inorganic acids and hydroxides.

10. A method of forming integrated circuit devices, comprising the steps of:
    forming an electrically insulating layer on a surface of a semiconductor wafer;
    forming a plurality of contact holes in the electrically insulating layer;
    depositing a tungsten metal layer that extends on the electrically insulating layer and into the plurality of contact holes; and
    polishing the tungsten metal layer using a slurry composition comprising hydrogen peroxide, an abrasive in an amount exceeding 8 wt %, an Fe-PDTA complex, diethylene glycol as a wetting agent and water.

11. The method of claim 10, wherein said polishing step is followed by the steps of:
    exposing the electrically insulating layer to a cleaning solution; and
    dicing the semiconductor wafer into a plurality of semiconductor chips.

12. The method of claim 11, further comprising the step of packaging the plurality of semiconductor chips into a plurality of packaged integrated circuit devices.

* * * * *